United States Patent
Stahr et al.

(10) Patent No.: US 10,356,904 B2
(45) Date of Patent: Jul. 16, 2019

(54) CONDUCTOR TRACK WITH ENLARGEMENT-FREE TRANSITION BETWEEN CONDUCTOR PATH AND CONTACT STRUCTURE

(71) Applicant: AT & S Austria Technologie & Systemtechnik Aktiengesellschaft, Leoben (AT)

(72) Inventors: Johannes Stahr, St. Lorenzen im Mürztal (AT); Wolfgang Schrittwieser, Kapfenberg (AT); Mike Morianz, Graz (AT); Christian Vockenberger, Leoben (AT); Markus Leitgeb, Trofaiach (AT)

(73) Assignee: AT&S Austria Technologie & Systemtechnik Aktiengesellshaft, Leoben (AT)

( * ) Notice: Subject to any disclaimer, the term of this patent is extended or adjusted under 35 U.S.C. 154(b) by 0 days.

(21) Appl. No.: 15/310,991

(22) PCT Filed: May 13, 2015

(86) PCT No.: PCT/EP2015/060681
§ 371 (c)(1),
(2) Date: Nov. 14, 2016

(87) PCT Pub. No.: WO2015/173347
PCT Pub. Date: Nov. 19, 2015

(65) Prior Publication Data
US 2017/0094795 A1    Mar. 30, 2017

(30) Foreign Application Priority Data
May 14, 2014    (AT) ............... A 50339/2014

(51) Int. Cl.
*H05K 1/18*    (2006.01)
*H05K 1/02*    (2006.01)
(Continued)

(52) U.S. Cl.
CPC .............. *H05K 1/18* (2013.01); *H05K 1/025* (2013.01); *H05K 1/0251* (2013.01); *H05K 1/09* (2013.01);
(Continued)

(58) Field of Classification Search
CPC .......... H05K 2201/09854; H05K 2201/09218; H05K 2201/09463; H05K 2201/09645;
(Continued)

(56) References Cited

U.S. PATENT DOCUMENTS

| 4,543,715 A * | 10/1985 | Iadarola | H05K 3/403 174/261 |
| 7,084,354 B2 * | 8/2006 | Boggs | H05K 1/115 174/260 |

(Continued)

FOREIGN PATENT DOCUMENTS

| DE | 43 43 843 A1 | 6/1995 |
| JP | 9-219468 A | 8/1997 |
| JP | 2014112629 A | 6/2014 |

OTHER PUBLICATIONS

SIPO of PR China, First Notification of Office Action, Examination of Application 201580038489.4, dated Jun. 27, 2018, pp. 1-3.

*Primary Examiner* — Roshn K Varghese
(74) *Attorney, Agent, or Firm* — Robert A. Blaha; Smith Tempel Blaha LLC

(57) ABSTRACT

The invention relates to an electronic device having an electrically isolating support structure, an electrically conducting conductor path on a surface of the support structure, and an electrically conducting contact structure which extends from the surface into the support structure and is electrically connected to the conductor path at a connection point, thereby forming a common conductor track. The
(Continued)

conductor path and the contact structure transition into each other in an enlargement-free manner at the connection point.

18 Claims, 6 Drawing Sheets

(51) Int. Cl.
| | | |
|---|---|---|
| *H05K 1/11* | (2006.01) | |
| *H05K 3/40* | (2006.01) | |
| *H05K 1/09* | (2006.01) | |
| *H05K 3/10* | (2006.01) | |
| *H05K 3/12* | (2006.01) | |
| *H05K 1/03* | (2006.01) | |

(52) U.S. Cl.
CPC ............... *H05K 1/115* (2013.01); *H05K 3/10* (2013.01); *H05K 3/40* (2013.01); *H05K 3/4053* (2013.01); *H05K 1/0306* (2013.01); *H05K 1/0366* (2013.01); *H05K 1/185* (2013.01); *H05K 3/1258* (2013.01); *H05K 2201/098* (2013.01); *H05K 2201/09218* (2013.01); *H05K 2201/09854* (2013.01)

(58) Field of Classification Search
CPC ... H05K 2201/1081; H05K 2201/1028; H05K 1/098; H05K 1/115; H05K 2201/0394; H05K 2201/09836; H05K 2201/0376; H05K 2201/09727; H05K 2201/09563; H05K 1/18; H05K 1/025; H05K 1/0251; H05K 1/09; H05K 1/0306; H05K 1/0366; H05K 1/185

USPC .......................... 361/760, 761, 762, 763, 764
See application file for complete search history.

(56) References Cited

U.S. PATENT DOCUMENTS

| | | | |
|---|---|---|---|
| 7,217,136 B2* | 5/2007 | Chang | H05K 1/0216 361/306.1 |
| 7,385,470 B2* | 6/2008 | Kwong | H05K 1/115 174/250 |
| 8,510,940 B2* | 8/2013 | Chen | C25D 5/022 174/262 |
| 2003/0215566 A1 | 11/2003 | Kung et al. | |
| 2005/0196898 A1* | 9/2005 | Ho | H01L 21/486 438/108 |
| 2006/0176139 A1 | 8/2006 | Pleskach et al. | |
| 2007/0222549 A1 | 9/2007 | Lim et al. | |
| 2008/0042785 A1* | 2/2008 | Yagisawa | H01P 1/2007 333/245 |
| 2010/0101851 A1* | 4/2010 | Muramatsu | H05K 1/116 174/262 |
| 2012/0182066 A1* | 7/2012 | Merkle | H05K 1/0243 174/250 |
| 2012/0255771 A1* | 10/2012 | Hu | H01L 21/486 174/266 |
| 2013/0009322 A1 | 1/2013 | Conn et al. | |
| 2013/0147266 A1* | 6/2013 | Bangtsson | B60R 16/02 307/9.1 |
| 2013/0186679 A1 | 6/2013 | Lee et al. | |
| 2013/0277099 A1 | 10/2013 | Wu | |
| 2014/0133117 A1* | 5/2014 | Saji | H05K 1/0243 361/761 |

* cited by examiner

CONDUCTOR TRACK WITH ENLARGEMENT-FREE TRANSITION BETWEEN CONDUCTOR PATH AND CONTACT STRUCTURE

CROSS-REFERENCE TO RELATED APPLICATIONS

This application is the entry into the national phase of international patent application PCT/EP2015/060681 which claims the benefit of the filing date of Austrian Patent Application No. A50339/2014, filed on May 14, 2014, the disclosures of which are hereby incorporated herein by reference in their entirety.

TECHNICAL FIELD

The invention relates to an electronic device, a method for manufacturing an electronic device, and a use.

TECHNOLOGICAL BACKGROUND

Different methods are known for embedding (passive and active) components within a printed circuit board. This technique is referred to as embedding. The connections between the components become ever smaller and finer due to the increasing miniaturization. Due to the reduction of the length of these connection paths, also the loss, and in sum the energy consumption, become ever smaller, too. Due to the short connection paths and the smaller distances resulting therefrom, the capacitive and inductive influences of the printed circuit board also become smaller, which allows ever higher cut-off frequencies of the embedded components.

Conventionally, a transition from a conductor path to a via is typically implemented with a pad, that is with an electrically conducting element that is locally enlarged (broadened) with respect to the conductor path and the via. Typically, such a pad is prescribed compulsorily in order to absorb production tolerances.

SUMMARY

There may be a need to provide an electronic device, which can be manufactured with little effort and which can handle even high frequency signals in a low-loss manner.

This need may be satisfied by the subjects having the features according to the independent patent claims. Further embodiment examples are shown in the dependent claims.

According to an embodiment example of the present invention, there is established an electronic device, which comprises an electrically isolating support structure, an electrically conducting conductor path at a surface of the support structure, and an electrically conducting contact structure, which extends from the surface into the support structure and which is electrically connected to the conductor path at a connection point, thereby forming a common conductor track, wherein the conductor path and the contact structure transition into each other in an enlargement-less manner at the connection point.

According to another embodiment example of the present invention, there is provided a method for manufacturing an electronic device, wherein in the method, an electrically isolating support structure is provided, an electrically conducting conductor path is formed at a surface of the support structure, and an electrically conducting contact structure is formed, which extends from the surface into the support structure and which is electrically connected to the conductor path at a connection point, thereby forming a common conductor track, wherein, at the connection point, the conductor path and the contact structure are formed transitioning into each other in an enlargement-free manner.

According to a further embodiment example of the present invention, a device having the features described above is used for transporting (in particular for coupling in) a high frequency signal, in particular having a frequency of at least about 10 GHz, for propagating (in particular with little harmonic waves, further particular free of harmonic waves) through the conductor track out of the conductor path and the contact structure, in particular by way of a wave propagation based on a hollow conductor.

According to a further embodiment example of the present invention, a device having the features described above is used for impedance matching of the conductor track.

According to a further embodiment example of the present invention, a device having the features described above is used for transmitting thermal energy in a heat barrier-free manner between the conductor path and the contact structure via the connection point (in particular for maximizing the heat transfer, for example by means of a sintered connection).

According to a further embodiment example of the present invention, a device having the features described above is used for transmitting electronic current in a low-loss manner between the conductor path and the contact structure via the connection point (in particular for maximizing the capability for passing current by minimizing the resistances of the electrical transitions).

According to embodiment examples of the present invention, there is established an electronic device, in which a direct electrically conducting connection is enabled between a conductor path on an electrically isolating support structure and a contact structure in the interior of the electrically isolating support structure without an enlargement structure arranged therebetween (for example in the form of an enlarging pad that is omitted according to the invention). Such an electronic device can advantageously be manufactured with little effort, because no separate procedure is necessary for the defined formation of an enlargement structure. Furthermore, such an electronic device can be used in operation in an energy-saving manner, because, when propagating high frequency signals through the conductor track formed of the conductor path and the contact structure, losses are strongly suppressed due to the homogeneous, electrically conducting transition and the few (little) contact resistances. The formation of the electrical transition without an enlargement also impedes the formation of parasitic modes and suppresses other parasitic effects, which can be triggered or fostered by an inhomogeneity at the connection between the conductor paths and the contact structure. Furthermore, the omission of an enlargement between the connection point and the conductor paths allows a continuous miniaturization. Thus, a higher integration density of components and electrical couplings can be achieved for example when the electronic device is formed as a printed circuit board. An improved capability of handling high frequency signals can be enabled with the device according to the invention in particular with the high frequency technology proceeding to ever higher frequencies, because the signals can be transmitted in a very low-loss manner, due to the onsetting skin effect, demonstratively similar as in a hollow conductor, by means of a transition between the conductor path and the contact structure, which transition is free from enlargements.

EXEMPLARY EMBODIMENTS

In what follows, additional exemplary embodiment examples of the device, the method, and the use are described.

According to an exemplary embodiment example, the connection point can be formed pad-free (in a pad-free manner). By providing no pads between the conductor paths and the contact structures, not only a simplified manufacturability may be achievable by saving a process step, but also a higher homogeneity with respect to the employed materials and structures may be achievable, and the number of material transitions may be reduced.

According to an exemplary embodiment example, the conductor path and the contact structure may have a constant cross-section (in particular a constant cross-sectional area and/or a constant cross-sectional shape) at least in the region of the connection point, preferably along the total extension of the conductor path and the contact structure. When high frequency signals propagate through the conductor path and subsequently through the contact structure (or in opposite direction), these signals may experience no distortion, such as those which may occur at discontinuities and which would impede the unrestrained propagation of high frequency signals, at the connection point and preferably along their total path through the conductor track.

According to an exemplary embodiment example, the conductor path and the contact structure may be formed of a homogeneous (or uniform) material and/or may transition in a seam-less manner into each other at least in the region of the connection point. The generation of a connection seam due to two different procedures for depositing electrically conductive materials for forming the conductor path and the contact structure may be avoided according to the described embodiment example, if the conductor path and the contact structure are manufactured in a common process (for example by means of a common simultaneous deposition of electrically conductive material in a surficial (arranged at the surface) notch and a deep hole, which is associated with the notch, in the electrically isolating support structure). The resulting seam-less connection may be less susceptible to faults for transmitted electrical signals and may therefore allow the operation of the electronic device with a lower energy consumption.

According to an exemplary embodiment example, the contact structure, preferably also the conductor path, may have a rectangular cross-section. With such a rectangular cross-section, an efficient wave propagation may be effected, if the skin effect leads to a propagation of the signals substantially only along an outer envelope of the conductor track, which may result in a particularly strong reduction of the power loss. Demonstratively, the propagation of the electrical high frequency signals in the conductor track may then be effected similar to the propagation of electromagnetic waves in a hollow space and/or in a cavity resonator. The satisfying of according conditions with respect to an efficient wave propagation (for example a resonance condition) may be effected by an according prescription of a length-to-wideness-ratio of the rectangular conductor track (for example a ratio of 2:3). Accordingly, the dimensions of the conductor track may be adapted also to a frequency of the propagating signals, which frequency can be prescribed by a driver circuit.

Alternatively, the contact structure, preferably also the conductor path, may have a rounded rectangular, or a rounded and/or oval cross-section. Other polygonal shapes may also be possible, such as for example an octahedron shape (with rounded corners, if necessary).

According to an exemplary embodiment example, the contact structure may extend into the support structure substantially perpendicular to an extension of the conductor path, and may in particular be formed as a via. Thus, the contact structure may be formed as a blind hole or a through-hole in the support structure, which hole may be filled with an electrically conductive material. An ascent connection between different (in particular electrically isolating) planes of the electronic device may be understood as a via, in particular completely connecting through between two opposing main surfaces of the support structure. Microvias having a diameter of less than 150 μm to 200 μm may be possible.

According to an exemplary embodiment example, the support structure may be selected from a group that consists of a resinous board (in particular a resin-glass fibre-board), a ceramic substrate, a glass substrate and an organic substrate. According to an embodiment of the electronic device as a printed circuit board (PCB), the support structure may have for example a mixture of an epoxy resin and glass fibres (for example prepreg), in particular FR4. A mixture of an epoxy resin and paper particles may also be possible (for example FR1). According to another embodiment, a substrate made of ceramic, glass or a carbon compound may be used, in order to form thereon and therein one or plural conductor tracks having a transition, which may be free from enlargements, between the conductor path and the contact structure.

According to an exemplary embodiment example, the conductor path and the contact structure may comprise copper (in particular copper that is formed by means of a galvanic method) or consist thereof. Alternatively or in addition, other materials may be used, for example silver, aluminium or nickel. It may also be possible to employ an electrically conducting polymer (in particular smart polymers) for this purpose.

According to an exemplary embodiment example, the device may comprise an electronic component (as an embedded component), which may be embedded in the support structure and is coupled electrically conductingly with the contact structure and/or the conductor path. The at least one electronic component may have an active electronic component and/or a passive electronic component. For example, it may be possible (in particular in the context of a signal guidance of a type of a cavity wave) to implement in the electrically isolating support structure a high frequency component (for example a mobile telecommunication chip, a transistor chip, or an antenna module) as the electronic component. In the context of an impedance matching, in particular a filter, a memory device (for example a DRAM) or a sensor may be implemented as the electronic component. In the context of an undisturbed heat transport, in particular an ohmic resistor, a sensor, a MOSFET, an IGBT, a power diode, a thyristor, or a thermistor may be implemented as the electronic component.

According to an exemplary embodiment example, an electrical contact of the electronic component on the one hand and the contact structure or the conductor path on the other hand can transition into each other without enlargement (in an enlargement-free manner) at another connection point of the device. Thus, an electrical coupling that is enlargement-free (in particular pad-free) may occur not only between conductor path and contact structure, but also between the contact structure and the electronic component, which may further improve the energy efficiency of the electronic device. Thus, the transmission of a high frequency signal may occur in a barrier-free manner and/or continuously (steadily) even at the electrical and mechanical interface between the contact structure and the electronic component.

According to an exemplary embodiment example, the device may have another conductor path on and/or in the support structure, in particular at another surface of the support structure that may be opposite to the surface having the conductor path, whereby the other conductor path and the contact structure transition into each other in an enlargement-free manner at a further connection point. Even, the electrically conductive connection between conductor paths at both opposite main surfaces of the device (for example a printed circuit board) may thus be performed through the support structure by means of a contact structure that may run orthogonal thereto and may be effected at both opposing main surfaces in an enlargement-free manner.

According to an embodiment example, the connection point between the conductor path and the contact structure may be formed such that an electrical high frequency signal that is coupled into the conductor track can propagate through the connection point, in particular without any reflection (anechoically). In particular, the geometry of the connection between the conductor path and the contact structure may be formed such that a continuous (steady) and interference-free transition of the signal between the conductor path and the contact structure is enabled. Stated differently, an undesired reflection of significant portions of the electrical high frequency signal at the connection point can be avoided in the case of a suitable configuration of the conductor path and the contact structure, in particular in their border zone, and thus a damping-free or at least poorly damped transmission of the electrical high frequency signal may be possible.

According to an exemplary embodiment example, the device may comprise a driver device (for example a driver circuit or a driver component), which may be configured to generate and couple in a high frequency signal into the conductor track, in particular to couple in a high frequency signal in the frequency range of at least about 10 GHz, in particular at least about 5 THz. The driver device may be formed, for example, as an electronic component and may be configured to generate a high frequency signal, which is coupled into the conductor track. Thanks to the enlargement-free transition between the conductor path and the contact structure, the high frequency signal may propagate, in particular resonantly, through the whole conductor track. According to an exemplary embodiment example, the edge steepness (or rate of change) of the high frequency signal may be greater than about 200 V per about 50 ps, i.e. greater than 4 V/ps. The enlargement-free transition may take a particular advantageous effect for such signals having a high edge steepness.

The high frequency signal that is to be coupled in according to exemplary embodiment examples may also have lower frequencies of, for example, about 100 kHz. In particular, such a high frequency signal may have a frequency of at least 10 kHz, further particularly between 10 kHz and 1 MHz. Using the enlargement-free transition it may be possible, for example, to couple in, to transport, and to process a rectangular signal having a typical frequency of 100 kHz and an edge steepness in the order of 50 V/ps. This may be relevant, for example, for applications, in which an impedance matching shall be effected by means of an enlargement-free transition. It shall be emphasized however, that other embodiment examples of the invention may operate in totally different frequency ranges.

According to an exemplary embodiment example, the device may be formed as a printed circuit board. A circuit board (circuit card, card, or printed circuit; printed circuit board, PCB) may be referred to as a support for electronic components. A circuit board may serve for the mechanical attachment and electrical connection. Circuit boards may have an electrically isolating material as a support structure having conductive connections adhering thereon, i.e. conductor paths and contact structures. Fibre-reinforced plastic may be possible [for use] as an isolating material. The circuit board(s) may be etched from a thin layer of copper.

According to an exemplary embodiment example, a diameter of the contact structure and/or of the conductor path may be in a range between about 1 μm and about 100 μm, in particular in a range between about 10 μm and about 30 μm. In particular for such dimensions, which may be extremely small for circuit boards, and for which the wave properties of high frequency signals may become significant, the enlargement-free transition point between the contact structure and the conductor path may be particularly advantageous.

According to an exemplary embodiment example, the support structure may be formed of a plurality of layers arranged on top of each other, wherein the device further comprises at least one additional electrically conducting structure (for example, in the form of at least one further conductor path) between the layers. The electronic arrangement may thus be formed as a multi-layer structure, in which electrical signals may be transmitted between different layers in a horizontal and/or vertical direction. In this way, also more complex circuit-wise (wiring) applications can be implemented using the device according to the invention.

According to a preferred exemplary embodiment example, the conductor path and the contact structure may be formed in a common procedure, in particular a simultaneous or uninterrupted procedure. Thereby, the simultaneous forming of conductor path(s) and contact structure(s) may ensure that the transition may be formed homogeneously and in an enlargement-free manner. Single tolerances, which may sum up in a separate manufacturing of conductor paths and a separate manufacturing of contact structures according to conventional approaches result in the necessity to provide bridging connection structures in the form of pads, in order to reliably enable an electrical coupling of a conductor path to a contact structure despite the tolerances. This may be avoided in a simultaneous definition of the position of conductor path and contact structure in a common procedure (in particular in a commonly formed cavity (or hollow space) in the support structure), because tolerances, which sum up independently from each other, may not occur in such a case.

According to an exemplary embodiment example, in the support structure, a contact opening, which may extend into the support structure, and which may subsequently be filled with an electrically conductive material, may be formed in the support structure, in order to thereby form the contact structure. The contact opening may be a vertical blind hole or a through-hole through the support structure.

According to an exemplary embodiment example, in the method, a notch (in particular an elongated recess in the support structure) may be formed at the surface of the support structure by means of material removal and may subsequently be filled with an electrically conducting material, in order to thereby form the conductor path. Accordingly, in the device, the conductor path may be formed as a notch, which may be filled with an electrically conducting material, in the surface of the support structure. The notch and the contact opening may be formed directly connecting to each other and may join directly with each other. The notch and the contact opening demonstratively may form the negative, or the inverse structure, of the conductor path and the contact structure.

Alternatively to the formation of a notch, which may then be filled with an electrically conducting material, the electrically conducting material may also be deposited on a planar surface of the support structure, in order to form the conductor paths. However, the formation of a notch may have the advantage that also a contact opening (in particular as a blind hole in, or as a through-hole through, the support structure) can be manufactured simultaneously therewith for a later formation of the contact structure, whereby advantageously a joint (common) definition of the spatial positions of the contact structure and the conductor paths may be enabled (preferably in a common method that removes material of the support structure), such that the contact structure and the conductor paths may be completed by filling the formed hollow structures with electrically conducting material, without a connection pad being necessary.

According to an exemplary embodiment example, at least one of the notch and the contact opening, preferably both, may be formed by means of laser grooving. A two-dimensional surface of the support structure can be scanned with a laser beam, whereby notches and/or contact openings may be formed by tracing a common trajectory in the surface, whereby the retention time (dwell time) of the laser at a particular position may define the depth of the notch and/or of the contact hole. In particular, the retention time in the regions of the surface, in which the notch (having a relatively small depth) is to be formed, may be shorter than the retention time in the regions of the surface, in which a contact hole (having a relatively great depth) may have to be formed. Thereby, both the conductor path and the contact structure connected therewith may be defined in a common process, whereby the conductor path and the contact structure connected therewith may be electrically conductingly connected to each other in a reliable manner even without a pad or another enlargement structure.

According to an exemplary embodiment example, at least one of the notch and the contact opening, preferably both, may be formed by means of a lithographic printing and etching technique. For this purpose, initially a photoresist (or any other resist) may be deposited on a surface of the support structure. By means of exposure (to light) and subsequent removing of a portion of the photoresist, a region of the surface of the support structure may then be uncovered. The uncovered surface region may then be processed by means of an etching treatment, whereby as a function of the duration of the etching process and/or as a function of the etching rate of a respective material section of the support structure, a notch (relatively short etching and/or etching of a material section of the support structure with a relatively low etching rate) and/or a contact opening (relatively long etching and/or etching of a material section of the support structure with a relatively high etching rate) can be produced with a definable depth. Preferably, the lithographic printing technique (and optionally also the etching technique) may be performed simultaneously in time at least section-wise, in order to define the notch and the contact hole in a joint (common) procedure.

According to still another exemplary embodiment example, at least one of the notch and the contact opening, preferably both, can be formed by means of embossing in the support structure. An embossing tool or the like, which may affect a surface of the support structure, may also define a notch as a basis for producing the conductor path, and a contact opening as a basis for producing the contact structure likewise in a joint procedure, without it being necessary to provide a pad or any other enlargement at the transition point.

According to an exemplary embodiment example, a procedure of defining the shape of the conductor path, and a procedure of defining a shape of the contact structure, may be performed uninterruptedly following up one after another or simultaneously (congruently in time or at least overlapping in time) with each other. Thus, it can be avoided that tolerances, which may sum up for separate processes, result in the necessity to provide a pad between the conductor path and the contact structure. For dimensions, which may be defined horizontally and vertically in a joint simultaneous process, conventional register problems between the conductor paths and the contact structures can be avoided, and thus pads can be made dispensable (unnecessary).

According to an exemplary embodiment example of the invention, there may be established a through connection of a circuit board, wherein the corresponding circuit board may integrate other components in its interior. Through connections in such a circuit board may pass through only one or all layers, and may be performed such that the incoming or diverting conductor path is guided directly into the through connection without any enlargement. The energy savings that can be achieved are particularly high, if the size of the boreholes is below 100 micrometer, preferably below 30 micrometer. The edge steepness of the transmitted signals may be preferably above 200 V per 50 picoseconds. The base material of a circuit board according to an exemplary embodiment example may be FR4, glass and/or a glass-type carrier material. An embedded electronic component may be integrated in the circuit board near (together with) a corresponding through connection.

Persons skilled in the art will understand that the enlargement-free transition between the conductor path and the contact structure may be realized at the connection point even, if an insignificant enlargement occurs in the context of technically (in particular conditional of manufacturing) unavoidable tolerances at the connection point, where the enlargement does not exceed such tolerances. One can assume an exemption of enlargement (implementation in an enlargement-free manner) in the sense of the claimed invention, in particular if and when the enlargement is only so insignificant that no interferences may occur in the signal propagation. The mentioned tolerances may arise, for example, during a lithographic printing process, wherein minor deviations from lithographic target conditions occur. Minor deviations from a complete exemption of enlargement may result thereby. In embodiment examples of the invention, a possible slight residual enlargement may in any case be smaller than in the case of a conventional arrangement of a pad between conductor path and contact structure. In a likewise manner, technical tolerances, which may lead to somewhat non-uniform widths, thicknesses and/or diameters across the cross-section of the conductor, may arise at any point of the cross-section of the conductor.

BRIEF DESCRIPTION OF THE DRAWINGS

The aspects defined above and further aspects of the invention are apparent from the examples of embodiment to be described hereinafter and are explained with reference to these examples of embodiments.

In what follows, exemplary embodiment examples of the present invention are explained in detail with reference to the following drawings.

DETAILED DESCRIPTION OF THE ILLUSTRATED EMBODIMENTS

Figure 1:
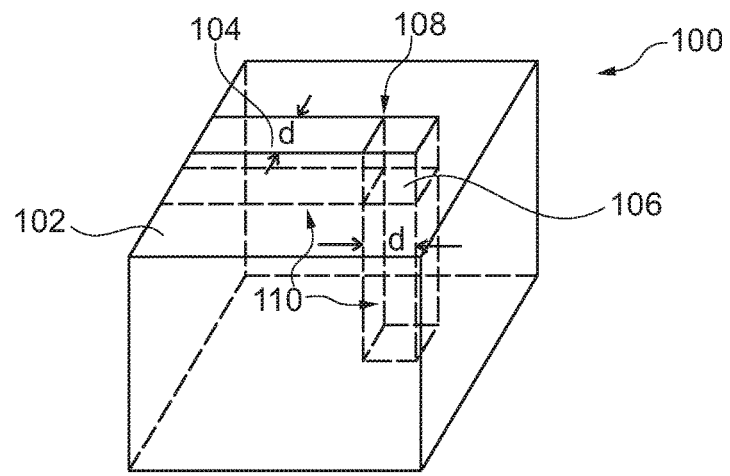
FIG. 1 shows a perspective view of an electronic device according to an exemplary embodiment example of the invention.

The invention will be described in more detail hereinafter with reference to examples of embodiment but to which the invention is not limited.

Same or similar components in different figures are provided with the same reference numerals.

Before exemplary embodiment examples of the invention shall be described with reference to the figures, some general aspects of the invention shall still be explained:

According to exemplary embodiment examples, a reduction of the energy consumption of components embedded in a circuit board can be achieved.

In the context of embedding techniques for embedding electronic components in a circuit board, it has been determined that the actual energy consumption may often lie above the calculated value. By means of investigations, it could be determined that above all the design rules for the design of circuit boards and the design of HDI circuit boards, which are presently conditional to the manufacturing process, may generate a relevant proportion of parasitic effects due to the prescription of a pad around a point of through connections, and thus may cause a disproportionately high increase of distortions (interferences) with increasing frequency. Furthermore, it was found that also the formation of parasitic modes may be fostered by these pads as from certain high frequencies.

Astonishingly, it was found now by the present inventors that the values of energy consumption can be brought in line to a large extent with the theoretical values by the omission of these pads for a via and by using the particularly preferable ultra-precise drillings (for minimizing mechanical false positionings). Also astonishingly, this omission of pads may also favour the suppression of parasitic modes, because a coupling, which may have a lower rate of failures (and thus with less modes), to the transitions can be effected by the direct coupling of vias and micro-vias to the conductor paths.

It was furthermore found that this embedding of the via directly in the conductor path, without an additional pad, may also represent a preferred type of coupling for a hollow conductor.

At very high frequencies, each via may also become a hollow conductor—and it may be precisely the coupling to this hollow conductor, which, without a pad, is associated with significantly less parasitic effects. Thereby, it was also determined that this functioning as a hollow conductor may arise already at lower frequencies as $\lambda/4$ and/or $\lambda/2$ of the resonator space, wherein $\lambda$ is the wavelength of the propagating high frequency signal.

It was furthermore found that also vias, which may be filled with a metal may become a hollow conductor as from certain frequencies due to the skin effect and that these optimizing effects may arise also in this context. These parasitic effects may show up particularly strongly precisely at high frequencies, and can be reduced particularly effectively by the omission of the pads.

FIG. 1 shows a perspective view of an electronic device 100 according to an exemplary embodiment example of the invention, which is formed as a circuit board.

The electronic device 100 has an electrically isolating support structure 102, which may be formed of a mixture of glass fibres and epoxy resin. An electrically conducting conductor path 104 made of copper is formed at a surface of the support structure 102, stated more precisely in a notch in the surface of the support structure 102. Alternatively, the circuit board 104 may also project elevatedly above a planar surface of the electrically isolating support structure 102. Furthermore, an electrically conducting contact structure 106 made of copper is provided, which extends as a via from the surface of the support structure 102 vertically into the support structure 102, and through the whole support structure 102 as far as to an opposing surface of the support structure 102. The contact structure 106 is electrically connected straightly and/or directly to the conductor path 104 at a connection point 108, thereby forming a common conductor track 110. Thus, the conductor path 104 and the contact structure 106 transition into each other in an enlargement-free manner at the connection point 108.

A width and/or a thickness of the conductor path 104 on one side of the connection point 108 may be equal to a width and/or a thickness of the contact structure 106 on the other side of the connection point 108. In the embodiment example shown, a diameter d of the contact structure 106 and the conductor path 104 may amount to 30 µm. The connection point 108 may be formed in a pad-free manner (i.e. without any pad), that is, it may couple the contact structure 106 to the conductor path 104 directly and without a pad arranged therebetween. The conductor path 104 and the contact structure 106 may have a constant rectangular cross-section in respect of the cross-sectional area and the cross-sectional shape in the region of the connection point 108, and also along the total extension of the conductor path 104 and the contact structure 106. The conductor path 104 and the contact structure 106 may be formed homogeneously from copper material also in the region of the connection point 108, whereby the material may be deposited on the support structure 102 and/or embedded therein in a joint (common) procedure. Thus, the conductor path 104 and the contact structure 106 may transition into each other in a seam-less manner. The connection may also be referred to as "landless".

Figure 2:
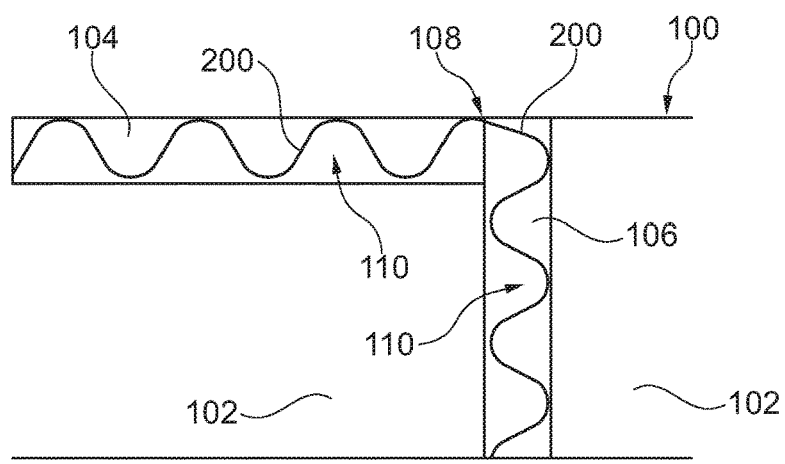
FIG. 2 shows a cross-sectional view of the electronic device of FIG. 1 together with a schematically illustrated high frequency signal, which propagates through a conductor track of the device.

FIG. 2 shows a cross-sectional view of the electronic device 100 of FIG. 1 together with a schematically depicted high frequency signal, which propagates through a conductor track 110 of the device 100. It can be gathered from FIG. 2 that due to its homogeneity, the connection point 108 may represent practically no barrier for the schematically depicted high frequency signal 200, such that a formation of undesired modes or other parasitic effects may not result at this position (at this site).

By forming the transition between the conductor path 104 and the contact structure 106 in an enlargement-free manner and in a pad-free manner, a homogeneous and interference-free propagation path through the whole conductor track 110 may feature (or may open up) for an electrical signal, and in a special way for a high frequency signal 200, such that no noteworthy damping of the signal may be effected in particular at the connection point 108. In this way, an energy-saving operation of the electronic device 100 may be possible. As a pad or an enlargement of electrically conducting structures may be dispensable at the connection point 108, high frequency signals can pass (or propagate) through the conductor path 110 in an approximately loss-free manner at highest frequencies of 100 GHz and more. Due to the skin effect, such high frequency signals may propagate substantially in a surficial (near surface) sheath section of the conductor track 110 and thus demonstratively may form ideally propagating cavity waves. Thus, the "landless" architecture according to FIG. 1 and FIG. 2 may be configured such that it is particularly advantageously suited for the transport of high frequency signals.

Figure 3:
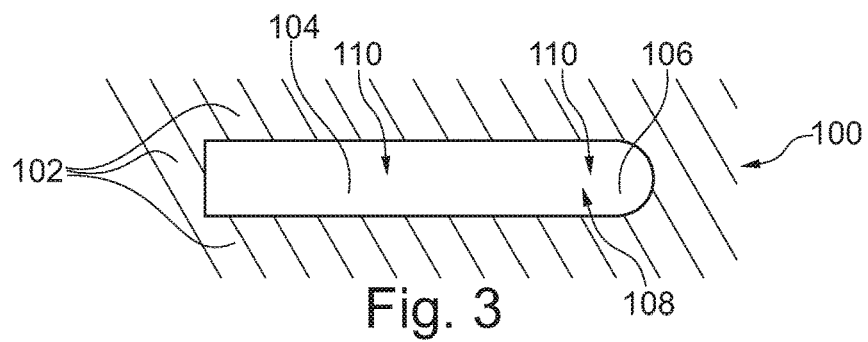
FIG. 3 shows a top view of an electronic device according to an exemplary embodiment example of the invention, in which a transition between a conductor path and a via is formed in a pad-free and an enlargement-free manner.
Figure 11:
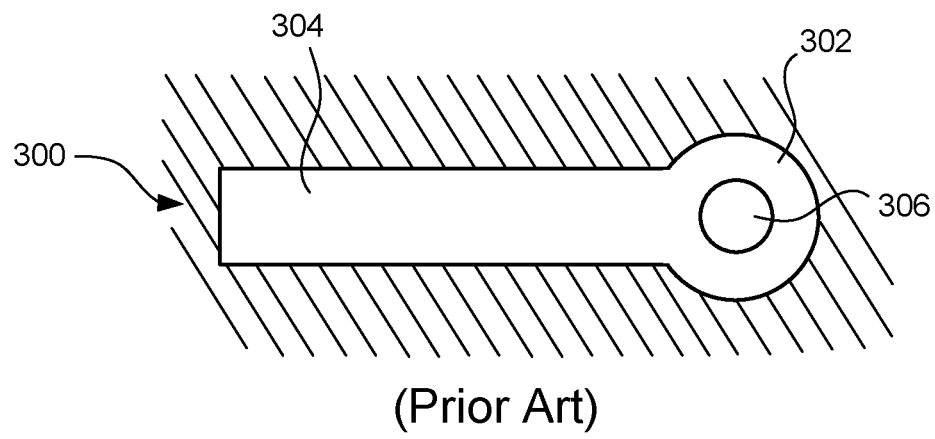
FIG. 11 shows a top view of a conventional electronic device having a pad between a conductor path and a via.

FIG. 11 shows a top view of a conventional electronic device 300 having a pad 302 arranged between a conductor path 304 and a via 306. Due to the mechanical inhomogeneity in the region of the transition between the conductor path 304 and the via 306 through the broad (wide) pad 302, mechanisms of energy loss of a propagating electrical signal, in particular of a high frequency signal, arise conventionally in this region. In contrast to this, a top view of an electronic device 100 according to an exemplary embodiment example of the invention as depicted in FIG. 3 shows a pad-free and enlargement-free transition at a connection point 108 between a conductor path 104 and a via 106.

Figure 4:
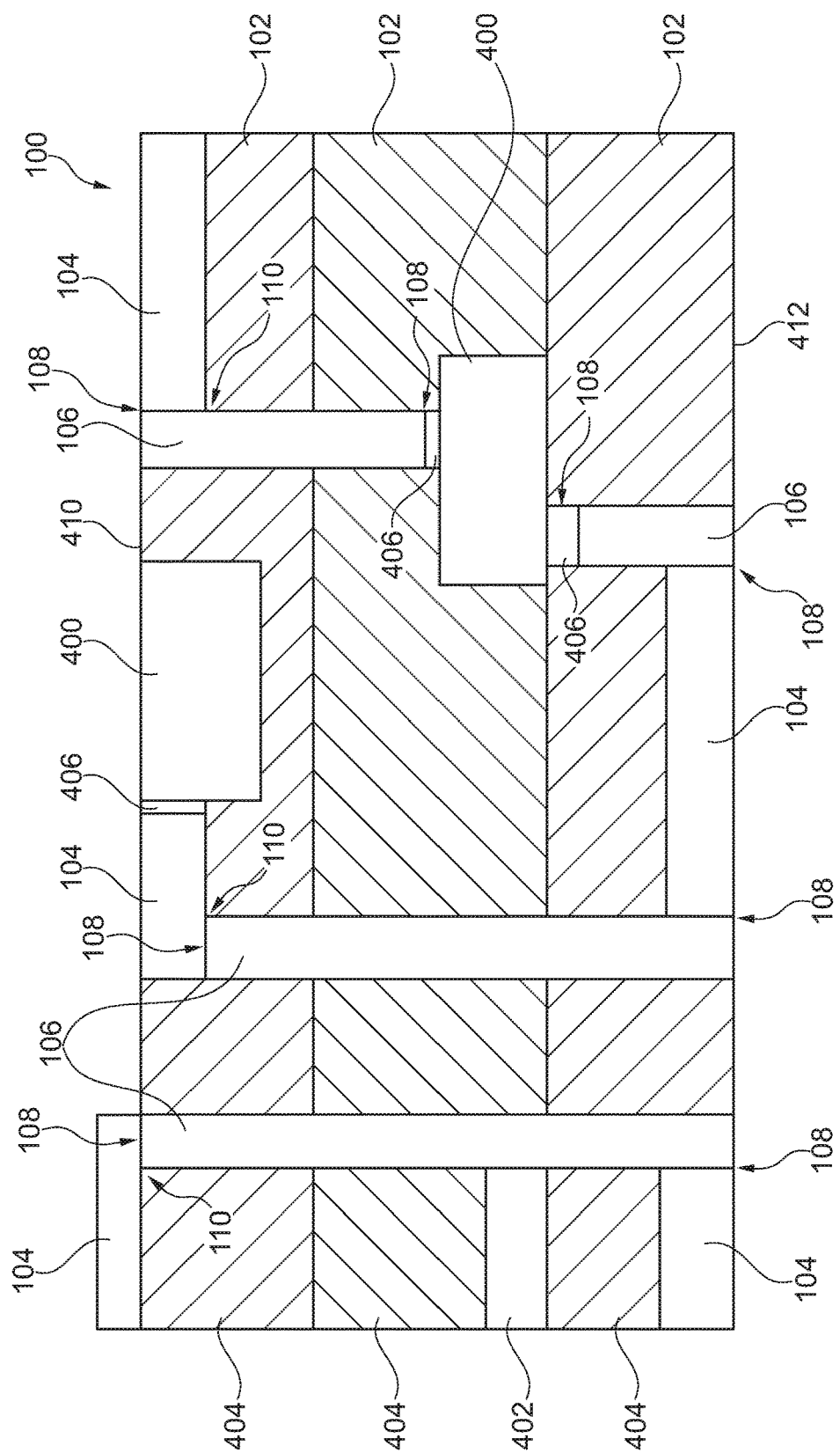
FIG. 4 shows a cross-sectional view of an electronic device according to an exemplary embodiment example of the invention, having embedded electronic components.

FIG. 4 shows a cross-sectional view of an electronic device 100 according to an exemplary embodiment example of the invention, which is formed as a multi-layer conductor path and has embedded electronic components 400.

The support structure 102 may be formed of a plurality of dielectric layers 404, which may be arranged on top of each other and which may be formed, for example, from resin-impregnated glass fibre mats (prepreg material) and may be pressed (grouted) with each other. The device 100 may further include an additional electrically conducting structure 402 in the form of a structured electrically conductive layer arranged between the layers 404, which may likewise be pressed between the layers 404, for example.

The device 100 may have a plurality of conductor paths 104 on the support structure 102, which may be arranged at the two opposing main surfaces 410, 412 of the support structure 102.

Furthermore, the device 100 may have electronic components 400, which may be embedded in the support structure 102 ("embedded components"), and which may be electrically conductingly coupled respectively to one of a plurality of vertical contact structures 106 and/or to one or plural horizontal conductor paths 104. The contact structures 106 and the conductor paths 104 may be coupled electrically conductingly with each other in a pad-free manner at respective connection points 108, thereby forming a respective conductor track 110. At another connection point 108, an electrical contact 406 of the electronic component 400 and the contact structure 106 may transition into each other in an enlargement-free manner. At further connection points 108, an electrical contact 406 of the electronic component 400 and a respective conductor path 104 may transition into each other in an enlargement-free manner.

One of the electronic components 400 may be implemented as a driver device, which may be configured for coupling a high frequency signal (see reference numeral 200 in FIG. 2) into the connected conductor track 110, wherein the high frequency signal may have a frequency of, for example, 500 GHz. An edge steepness of the high frequency signal may be preferably greater than 200 V per 50 ps.

As can be gathered from FIG. 4, each of the transitions 108 between a conductor path 104, a contact structure 106, an electrical contact 406 of the electronic component 400 may be formed in a pad-free and an enlargement-free manner. Thus, the multi-layered device 100 may be extremely energy-saving as for its method of operation, compact and easily manufacturable as well as configurable in a virtually arbitrary electronic complexity.

For example, the electronic component 400, which may be embedded in the middle layer 404, can be used as the driver device for generating a high frequency signal, which can be guided via the electronic contact 406 formed at the lower side of the electronic component 400, a vertical contact structure 108, a conductor path 104 arranged at the lower side of the device 100, a vertical contact structure 106, a conductor path 104 arranged at the upper side of the device 100, a further electrical contact 406 as far as to the electronic component 400 that may be exposed at the upper surface of the device 100 (for example, formed as a sensor). Because all the transitions 108 may be formed in an enlargement-free manner, the signal can propagate through the device 100 in an unimpeded way and thus without losses of energy and quality.

Figure 5:
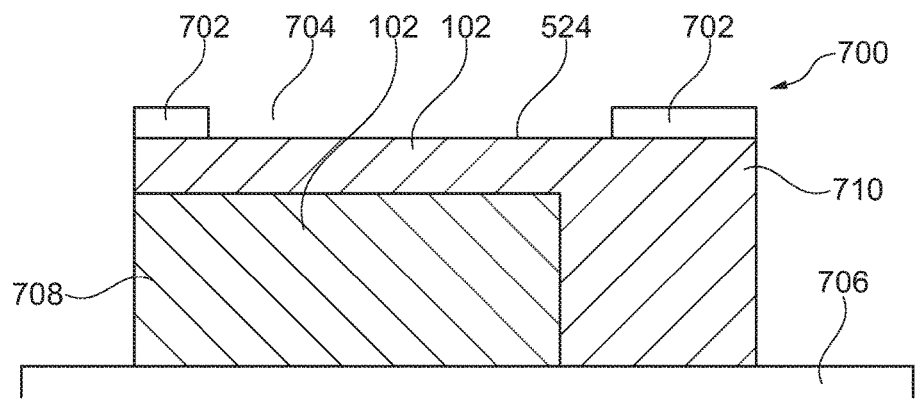
FIG. 5 and FIG. 6 show an arrangement during a method for manufacturing an electronic device according to an exemplary embodiment example of the invention, wherein a notch and a contact opening are formed in an electrically isolating support structure by means of a lithographic printing and etching technique.
Figure 6:
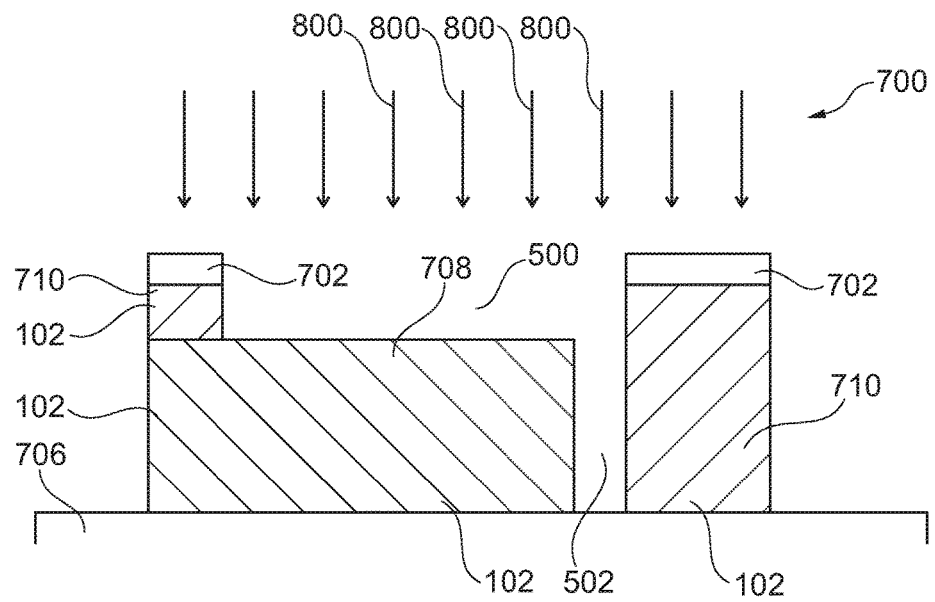

FIG. 5 and FIG. 6 illustrate an arrangement 700, which can be used during a method for manufacturing an electronic device 100 according to an exemplary embodiment example of the invention. In this manufacturing method, a notch 500 and a contact opening 502 may both be formed by means of a joint (common) lithographic printing technique (see FIG. 5) and etching technique (see FIG. 6). The support structure 102 may be arranged on a temporary support 706 during the execution of the lithographic printing and etching technique.

In the lithographic printing technique that is schematically depicted in FIG. 5, a resist 702 may be deposited on the main surface 524 of the support structure 102, and may be structured by means of exposure (to light), using a mask. Thus, an access opening 704 may be defined, at which a subsequent etching technique may attack material of the electrically isolating support structure 102.

According to the etching technique depicted in FIG. 6, an etching attack may be effected, which is schematically depicted by the reference numeral 800, which may selectively remove material of the support structure 102 by means of etching, which material may be exposed at the access opening 704 and is not covered with the remaining resist 702. The etching may be performed for example by means of plasma etching, chemical etching, wet etching, or dry etching. Furthermore, FIG. 6 shows that in the embodiment example shown, the support structure 102 may have an etch stop structure 708, which may be formed of a material that may remain protected against a removal by means of etching during the etching procedure. By contrast, etchable material 710 of the electrically isolating support structure 102 may be removed by means of etching during the etching procedure. If the position of the etch stop structure 708 is known, the notch 500 and the contact opening 502 may be created simultaneously using a single etching process at a precise position and without register problems, therefore without the need to provide pads for compensating relative position tolerances.

Figure 7:
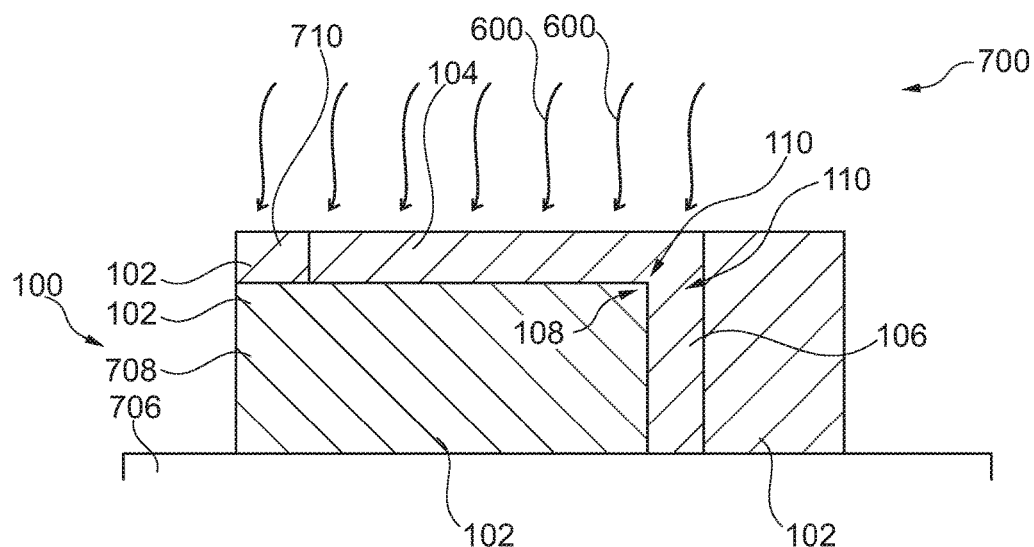
FIG. 7 shows the arrangement of FIG. 5 and FIG. 6 at a later point in time, at which the notch and the contact opening are filled with an electrically conductive material.

FIG. 7 shows the arrangement 700 according to FIG. 5 and FIG. 6 at a later point in time, at which the notch 500 and the contact opening 502 may be filled with an electrically conducting material. The deposition technique for depositing the electrically conducting material, see reference numeral 600, can be executed as according to FIG. 6.

Figure 8:
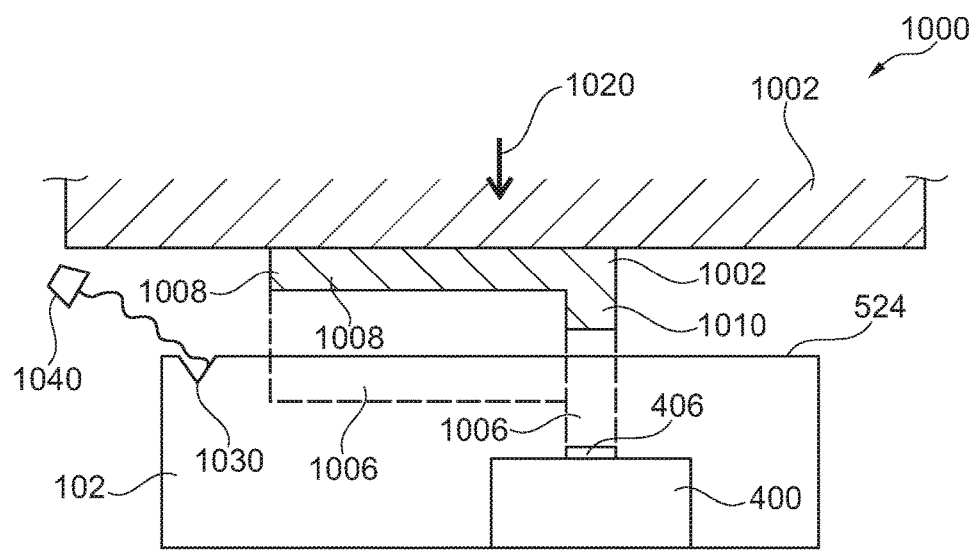
FIG. 8 shows an arrangement during a method for manufacturing an electronic device according to an exemplary embodiment example of the invention, wherein a notch and a contact opening are formed in an electrically isolating support structure by means of embossing, and wherein an electronic component that is to be contacted electrically is already embedded in the support structure.

FIG. 8 shows an arrangement 1000, which can be employed during a still different method for manufacturing an electronic device 100 according to an exemplary embodiment example of the invention, in which a notch 500 and a contact opening 502 can be formed by means of embossing in an electrically isolating support structure 102, in which an electronic component that is to be contacted electrically may already be embedded.

According to FIG. 8, an embossing tool 1002 may be pressed onto the main surface 524 of the support structure 102 (see reference numeral 1020). As the embossing tool 1002 may be provided with a negative profile 1004 at its surface, the shape of an embossing hole 1006 in the support structure 102 can be prescribed by the shaping of the negative profile 1004. The negative profile 1004 may have a notch-shaping section 1008 for forming the notch 500, and a contact opening-shaping section 1010 for shaping the contact opening 502.

Optionally, an alignment marker 1030, for example a surface chamfer, may be provided at the support structure 102, in order to ensure, for example optically (see detector 1040), a correct positioning of the embossing tool 1002 relative to the support body 102.

A subsequent depositing technique for depositing an electrically conducting material can be performed, for example, by means of sputtering, chemical vapour phase deposition, etc.

Figure 9:
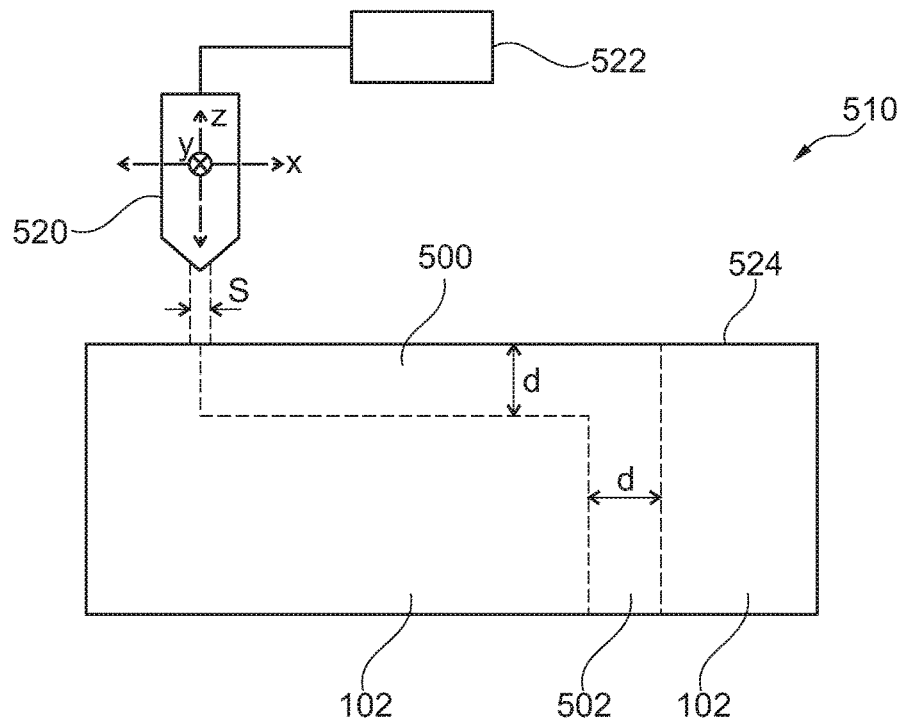
FIG. 9 shows an arrangement during a method for manufacturing an electronic device according to an exemplary embodiment example of the invention, wherein a notch and a contact opening are formed in an electrically isolating support structure by means of laser grooving.

FIG. 9 shows an arrangement 510, which can be used for executing a method for manufacturing an electronic device 100 according to an exemplary embodiment example of the invention. In the method, a notch 500, which may run horizontally at a main surface 524 of an electrically isolating support structure 102, and a contact opening 502, which may extend vertically through the electrically isolating support structure 102, can be formed by means of laser grooving.

A laser 520, which may be controllable by means of a control device 522 and which may be manoeuvrable along all the three mutually orthogonal directions in space (x, y and z) along a prescribable trajectory along the main surface 524 of the electrically isolating support structure 102 with a retention time (dwell time) that can be adjusted at a respective position, is configured for forming recesses in the main surface 524 of the electrically isolating structure 102 by means of laser grooving. The control device 522 may execute an according control program, by means of which the laser 520 may be displaced along the prescribed trajectory and thus with an adjustable movement profile in the xy-plane and may thereby remain at each position for a prescribable retention time. In this way, a surface profile of a definable depth distribution can be generated, and thereby, a recess, which may correspond to the conductor track 110 and/or may be inverse thereto, can be formed likewise. The recess forms the notch 500 and the contact opening 502, which may join directly thereto and may thus be connected thereto. Because a width s (for example 8 μm) of the laser beam may be significantly smaller than a thickness d (for example 50 μm) to be adjusted of the notch 500 and/or of the contact opening 502, a precise definition of the shape of the notch 500 and of the contact opening 502 may be possible in a joint procedure.

FIG. 5 therefore illustrates the execution of a first phase of a method for manufacturing an electronic device 100, wherein in the method, an electrically isolating support structure 102 is initially provided as a starting structure. In the method, the notch 500 may be formed by means of removing material at the surface of the support structure 102. Furthermore, in a procedure, which may be joint (common) with the formation of the notch, the contact opening 502 that may extend into the support structure 102 may be formed in the support structure 102. Hence, the notch 500 and the contact opening 502 may be formed in a joint, simultaneous and uninterrupted procedure due to the laser grooving technique being executed uninterruptedly.

Figure 10:
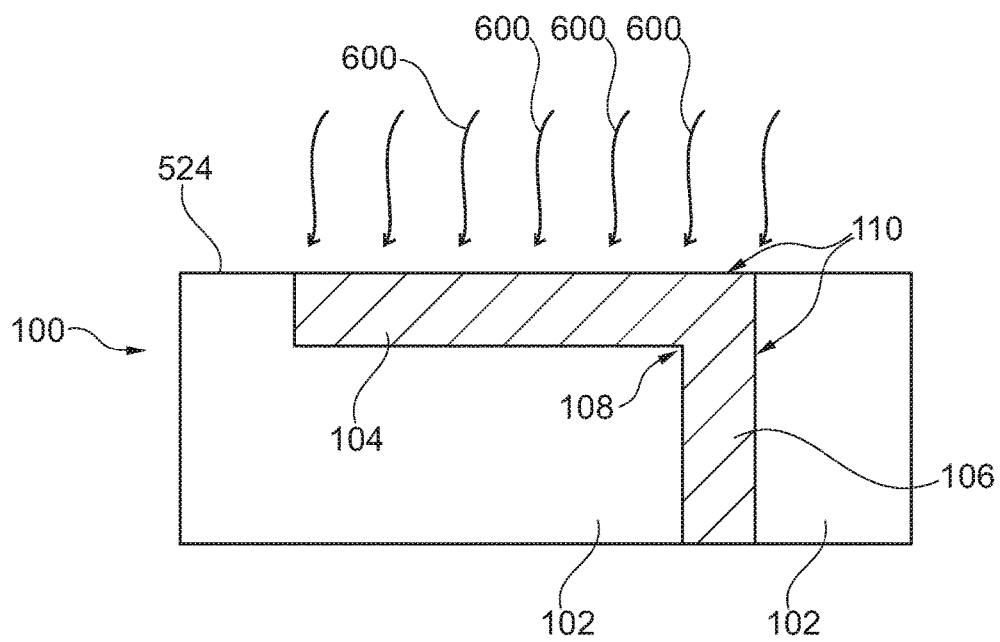
FIG. 10 shows the arrangement according to FIG. 9 at a later point in time, at which the notch and the contact opening are filled with an electrically conductive material.

The notch 500 and the contact opening 502 may subsequently be filled with an electrically conducting material, as shown in FIG. 10, in order to thereby form the contact structure 106.

In the method according to FIG. 9, a procedure of defining a shape of the contact structure 106 (as the inverse of the contact hole 502) may follow up without interruption to a procedure of defining a shape of the conductor path 104 (as the inverse of the notch 500). Advantageously, this may make dispensable the formation of a contact bridge in the form of a pad, such as it is conventionally required in the case of two procedures that are separated from each other and that each have different tolerances for compensating register problems.

FIG. 10 shows the arrangement 510 of FIG. 9 at a later point in time, at which the notch 500 and the contact opening 502 may be filled with an electrically conducting material, in order to thereby form the conductor path 104 and the contact structure 106.

The formation of the electrically conducting conductor path 104 at a surface of the support structure 102 and the formation of an electrically conducting contact structure 106, which may extend from the surface into the support structure 102 and may be electrically connected to the conductor path 104 at a connection point 108, thereby forming a common conductor track 110, may be carried out simultaneously by means of the deposition of the material, as is indicated with the reference numeral 600. In this way, the conductor path 104 and the contact structure 106 may transition into each other in an enlargement-free manner at the connection point 108, and may have a continuous (steady) and/or homogeneous composition of material, even at the connection point 108. Consequently, the conductor path 104 and the contact structure 106 may be formed in a joint, simultaneous and uninterrupted (interruption-free) procedure due to the joint deposition technique.

The deposition of the material, see reference numeral 600, may be effected, for example, by means of sputtering, chemical vapour phase deposition, etc.

Supplementarily, it is to be noted that "having" does not exclude other elements or steps, and that "a" or "an" does not exclude a plurality. Furthermore, it should be noted that features or steps, which have been described with reference to one of the afore-mentioned embodiment examples, can be used also in combination with other features or steps of other embodiment examples described above. Reference numerals in the claims are not to be considered as a limitation.

The invention claimed is:

1. An electronic device, comprising:
    an electrically isolating support structure, wherein the electrically isolating support structure comprises one of a resinous board, a glass substrate and an organic substrate;
    a first electrically conducting conductor path at a surface of the support structure;
    an electrically conducting contact structure in the interior of the electrically isolating support structure, which extends from the surface into the support structure and which is electrically connected to the first conductor path at a connection point, thereby forming a common conductor track,
    wherein the electrically conducting contact structure is formed as a blind hole or a through-hole in the electrically isolating support structure, which hole is filled with an electrically conductive material;
    a driver device, which is configured to couple a high frequency signal into the common conductor track,
    wherein the first conductor path and the contact structure transition into each other in an enlargement-free manner at the connection point; and
    a second conductor path on and/or in the support structure, wherein at a further connection point, the second conductor path and the contact structure transition into each other in an enlargement-free manner.

2. The electronic device according to claim 1, wherein the connection point is formed in a pad-free manner.

3. The electronic device according to claim 1, wherein one of the following is implemented:
    the first conductor path and the contact structure have a constant cross-section at least in the region of the connection point,
    at least in the region of the connection point, the first conductor path and the contact structure are formed of a homogeneous material,
    in the region of the connection point, the first conductor path and the contact structure transition into each other in a seam-free manner.

4. The electronic device according to claim 1, wherein the contact structure, has or have:
    a polygonal cross-section; or
    a rounded polygonal cross-section; or
    a round cross-section, and/or
    wherein the contact structure extends perpendicular to an extension of the first conductor path into the support structure as a via.

5. The electronic device according to claim 1, wherein the first conductor path and the contact structure include copper and/or silver and/or aluminium and/or an electrically conducting polymer.

6. The electronic device according to claim 1, further comprising:
    an electronic component, which is embedded in the support structure and is coupled electrically conductingly to the contact structure and/or the first conductor path,
    wherein the electronic component is selected from a group that consists of an active electronic component and a passive electronic component as one out of the group that consists of a filter, a voltage converter, a semiconductor chip, a storage module, a capacitor, an ohmic resistor, an inductor, a sensor, and a high frequency component, and/or
    wherein at another connection point, an electrical contact of the electronic component on the one hand and the contact structure or the first conductor path on the other hand transition into each other in an enlargement-free manner.

7. The electronic device according to claim 1, wherein the second conductor path on and/or in the support structure is at another surface of the support structure, which surface is opposite to the surface comprising the first conductor path.

8. The electronic device according to claim 1, wherein the connection point is formed between the first conductor path and the contact structure such that an electrical high frequency signal that is coupled into the conductor track can propagate through the connection point in a reflexion-free anechoic manner.

9. The electronic device according to claim 1, wherein the driver device is configured for coupling in a high frequency signal in a frequency range of at least 10 GHz,
    wherein the driver device is configured for coupling in the high frequency signal with an edge steepness of greater than 4 V/ps.

10. The electronic device according to claim 1, formed as a printed circuit board.

11. The electronic device according to claim 1, wherein a diameter of the contact structure and/or of the first conductor path is in a range between 1 µm and 100 µm.

12. The electronic device according to claim 1, wherein the support structure is formed of a plurality of layers that are arranged on top of each other, and wherein the device further has at least a further electrically conducting structure between the layers.

13. The electronic device according to claim 1, wherein the first conductor path is formed as a notch, which is filled with an electrically conducting material, in the surface of the support structure.

14. A method for manufacturing an electronic device, the method comprising:
    providing an electrically isolating support structure, wherein the electrically isolating support structure comprises one of a resinous board, a glass substrate and an organic substrate;
    forming a first electrically conducting conductor path at a surface of the support structure;
    forming an electrically conducting contact structure in the interior of the electrically isolating support structure, which extends from the surface into the support structure and which is electrically connected to the first conductor path at a connection point, thereby forming a common conductor track,
    wherein a notch is formed at the surface of the support structure by material removal and is subsequently filled with an electrically conducting material, in order to thereby form the conductor path, and/or
    wherein in the support structure, a contact opening is formed, which extends into the support structure, and which is subsequently filled with an electrically conducting material, in order to thereby form the contact structure, such that the electrically conducting contact structure is formed as a blind hole or a through-hole in the electrically isolating support structure, which hole is filled with an electrically conductive material;

providing a driver device, which is configured to couple a high frequency signal into the conductor track;

wherein, at the connection point, the first conductor path and the contact structure are formed transitioning into each other in an enlargement-free manner; and forming a second conductor path on and/or in the support structure, wherein at a further connection point, the second conductor path and the contact structure transition into each other in an enlargement-free manner.

15. The method according to claim 14, wherein the first conductor path and the contact structure are formed in a joint procedure.

16. The method according to claim 14, having at least one of the following features:

at least one of the notch and the contact opening, preferably both, is or are formed by means of a lithographic printing and etching technique;

at least one of the notch and the contact opening, preferably both, is or are formed by means of embossing in the support structure;

at least one of the notch and the contact opening, preferably both, is or are formed by means of laser grooving.

17. The method according to claim 14, wherein a procedure of defining a shape of the first conductor path and a procedure of defining a shape of the contact structure follow up uninterruptedly to each other, or are carried out simultaneously with each other.

18. A method of use of an electronic device, which has an electrically isolating support structure, wherein the electrically isolating support structure comprises one of a resinous board, a glass substrate and an organic substrate, a first electrically conducting conductor path at a surface of the support structure, and an electrically conducting contact structure in the interior of the electrically isolating support structure, which extends from the surface into the support structure and which is electrically connected to the first conductor path at a connection point, thereby forming a common conductor track, wherein the electrically conducting contact structure is formed as a blind hole or a through-hole in the electrically isolating support structure, which hole is filled with an electrically conductive material, wherein at the connection point, the first conductor path and the contact structure transition into each other in an enlargement-free manner, the electronic device having a second conductor path on and/or in the support structure, wherein at a further connection point, the second conductor path and the contact structure transition into each other in an enlargement-free manner, the use for one of the following:

transporting a high frequency signal having a frequency of at least 10 GHz, for propagating in a manner free of harmonic waves, through the conductor track out of the first conductor path and the contact structure, impedance matching of the conductor track, transmitting thermal energy in a heat barrier-free manner between the first conductor path and the contact structure via the connection point, transmitting electrical current in a low-loss manner between the first conductor path and the contact structure via the connection point.

* * * * *